United States Patent
Hariharan et al.

(10) Patent No.: US 7,227,356 B1
(45) Date of Patent: Jun. 5, 2007

(54) METHOD AND APPARATUS OF MULTI-ECHO MR DATA ACQUISITION WITH NON-DISCRETE FLIP ANGLE TRAIN

(75) Inventors: Hari Hariharan, Pewaukee, WI (US); Anthony Vu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 76 days.

(21) Appl. No.: 10/711,239

(22) Filed: Sep. 3, 2004

(51) Int. Cl.
*G01V 3/00* (2006.01)
(52) U.S. Cl. .................................. 324/307; 324/309
(58) Field of Classification Search ............... 324/309, 324/307
See application file for complete search history.

(56) References Cited

U.S. PATENT DOCUMENTS

| | | | |
|---|---|---|---|
| 5,345,176 A * | 9/1994 | LeRoux et al. | 324/309 |
| 5,499,629 A * | 3/1996 | Kerr et al. | 600/410 |
| 6,163,153 A * | 12/2000 | Reiderman et al. | 324/314 |
| 6,230,039 B1 * | 5/2001 | Stuber et al. | 600/410 |
| 6,252,400 B1 * | 6/2001 | Loncar et al. | 324/309 |
| 6,489,766 B1 * | 12/2002 | Alsop | 324/313 |
| 6,850,063 B2 * | 2/2005 | Hennig | 324/314 |
| 6,968,225 B2 * | 11/2005 | Vu | 600/410 |
| 7,075,299 B1 * | 7/2006 | Peters | 324/309 |

OTHER PUBLICATIONS

David C. Alsop, The Sensitivity of Low Flip Angle RARE Imaging, Magnetic Resonance in Medicine, 1997, pp. 176-184, vol. 37, No. 0740-3194/97, Publisher: Williams & Wilkins, Published in: USA.
Juergen Hennig et al., Calculation of Flip Angles for Echo Trains with Predefined Amplitudes with the Extended Phase Graph (EPG)-Algorithm, Magnetic Resonance in Medicine, 2004, pp. 68-80, vol. 51, Publisher: Wiley InterScience, Published in: online.
John P. Mugler III et al., T2-Weighted 3D Spin-Echo Train Imaging of the Brain at 3 Tests: Reduced Power Deposition Using Low Flip-Angle Refocusing, Proc. Intl. Soc. Mag. Reson. Med, 2001, pp. 438, vol. 9, Published in: USA.

* cited by examiner

*Primary Examiner*—Brij Shrivastav
*Assistant Examiner*—Megann E Vaughn
(74) *Attorney, Agent, or Firm*—Ziolkowski Patent Solutions Group, SC; Michael A. Della Penna; Carl B. Horton

(57) ABSTRACT

An imaging technique is disclosed to reduce ringing artifacts from amplitude decay in MR multi-echo acquisition. A flip angle train is determined to match scan parameters for an MR scan to acquire MR data from a given tissue. Reducing the effects of amplitude decay in the echo signal reduces ringing artifacts and thereby improves image quality.

9 Claims, 5 Drawing Sheets

METHOD AND APPARATUS OF MULTI-ECHO MR DATA ACQUISITION WITH NON-DISCRETE FLIP ANGLE TRAIN

BACKGROUND OF THE INVENTION

The present invention relates generally to MR imaging and, more particularly, to a method and apparatus to reduce ringing artifacts in multi-echo acquisition using a non-discrete flip angle train. The present invention is particularly applicable with fast spin echo (FSE) imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

As is well-known, reducing the duration of an MR scan has a number of advantages. For example, as scan time is reduced, patient throughput increases. An increase in patient throughput allows more subjects to be imaged in a given period of time or support more comprehensive scans without a time penalty. Additionally, it is generally well-known that some subjects, and in particular, children, the elderly, and those that are claustrophobic, are prone to movement during the data acquisition process. This movement can introduce motion artifacts in the final reconstructed image thereby jeopardizing the diagnostic value of the final image. Accordingly, by reducing the duration of the scan it is possible to reduce the likelihood of subject motion induced artifacts in the reconstructed image.

FSE is an imaging technique that has been developed and widely known to reduce scan time. FSE is widely used for spin—spin relaxation weighted imaging, proton density imaging, and spin-lattice relaxation weighted imaging in relatively short periods of time. Moreover, FSE imaging may be implemented for neural imaging, body imaging, and extremity imaging.

FSE imaging utilizes a multi-echo, spin-echo pulse sequence where different parts of k-space are acquired by different spin echoes. For example, a four echo spin-echo sequence may be applied such that k-space is segmented into four sections. As such, the first echo may be used to fill a center of k-space, the second echo for k-space adjacent to the center, and so forth, with the data from the last spin-echo used to fill the outermost regions of k-space. Since four echoes rather than one are used to fill k-space, scan time, in this example, may be reduced four-fold.

In FSE imaging with long echo trains, the observed echo amplitudes typically exhibit an amplitude decay based on tissue T1 and T2 values. This decay can result in undesirable ringing artifacts, particularly in long echo train images.

Additionally, with high field acquisitions, e.g. 3T and above, maintaining RF power deposition (SAR) in the imaging bore during the acquisition process is critical. This is particularly critical for multi-echo acquisitions such as FSE. Several strategies have been developed to address both signal amplitude decay and RF power deposition during multi-echo acquisitions.

One known strategy utilizes a variable flip angle train to improve image quality and maintain RF deposition within prescribed limits. However, current state of the art techniques using this strategy provide discrete flip angle trains that are not flexible to take into account prescription parameters such as echo train length, echo spacing times. As such, these techniques yield flip angle trains that are not matched to the parameters of the prescription. Also, these techniques generally fail to take into account changes in tissue type when determining the respective flip angles of the data acquisition pulses of the multi-echo acquisition.

It would therefore be desirable to have a method capable of automatically determining the flip angles for each data acquisition pulse of a multi-echo acquisition that is based on tissue type as well as scan prescription parameters on a per-scan basis.

BRIEF DESCRIPTION OF THE INVENTION

The present invention provides a method and apparatus of automatically determining the flip angle train for a multi-echo acquisition of data from a given tissue type to reduce ringing artifacts that overcome the aforementioned drawbacks.

An imaging technique, that is particularly applicable with FSE imaging, to reduce ringing artifacts associated with amplitude decay in multi-echo acquisitions is disclosed. Flip angles for each data acquisition pulse of a multi-echo acquisition are determined for a given tissue type and desired scan parameters on a per-scan basis to maintain a relatively constant target amplitude of each echo during sampling. The flip angle for each data acquisition pulse may be determined from a polynomial expression recalled from a database of stored flip angle polynomial expressions closely matching both the tissue type and desired scan parameters. However, the flip angles may also be determined on-the-fly for a given scan prescription.

Therefore, in accordance with one aspect of the present invention, an MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus also includes a computer programmed to determine, in real-time, a respective flip angle for each data acquisition pulse of a pulse sequence for multi-echo acquisition of MR data matched to a given target tissue and a given scan prescription to reduce ringing artifacts from amplitude decay of the multi-echo acquisition.

In accordance with another aspect of the invention, a method is introduced that includes the step of receiving a user input of a given tissue targeted for MR data acquisition and at least one parameter of a scan to acquire MR data. The method also includes the step of determining an echo train duration time for a multi-echo acquisition of MR data for a scan carried out with the at least one parameter to acquire MR data with contrast of the given tissue. The method further includes the steps of determining a target amplitude for a majority of echoes of the multi-echo acquisition and determining a flip angle for each data acquisition pulse of the multi-echo acquisition to acquire MR data such that, for the majority of the echoes of the multi-echo acquisition, a maximum echo amplitude is substantially equal to the target amplitude.

In accordance with another aspect of the invention, the invention is embodied in a computer program stored on a computer readable storage medium and having instructions which, when executed by a computer, cause the computer to determine a target amplitude versus echo train time relationship for a multi-echo acquisition of MR data from a given target tissue. The computer is further caused to determine a desired maximum amplitude for a plurality of echoes of the multi-echo acquisition for a user-prescribed MR scan from the target amplitude versus echo train time relationship. The computer is further caused to determine a flip angle for each data acquisition pulse of the prescribed MR scan such that the plurality of echoes has a maximum amplitude substantially equal to the desired maximum amplitude.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
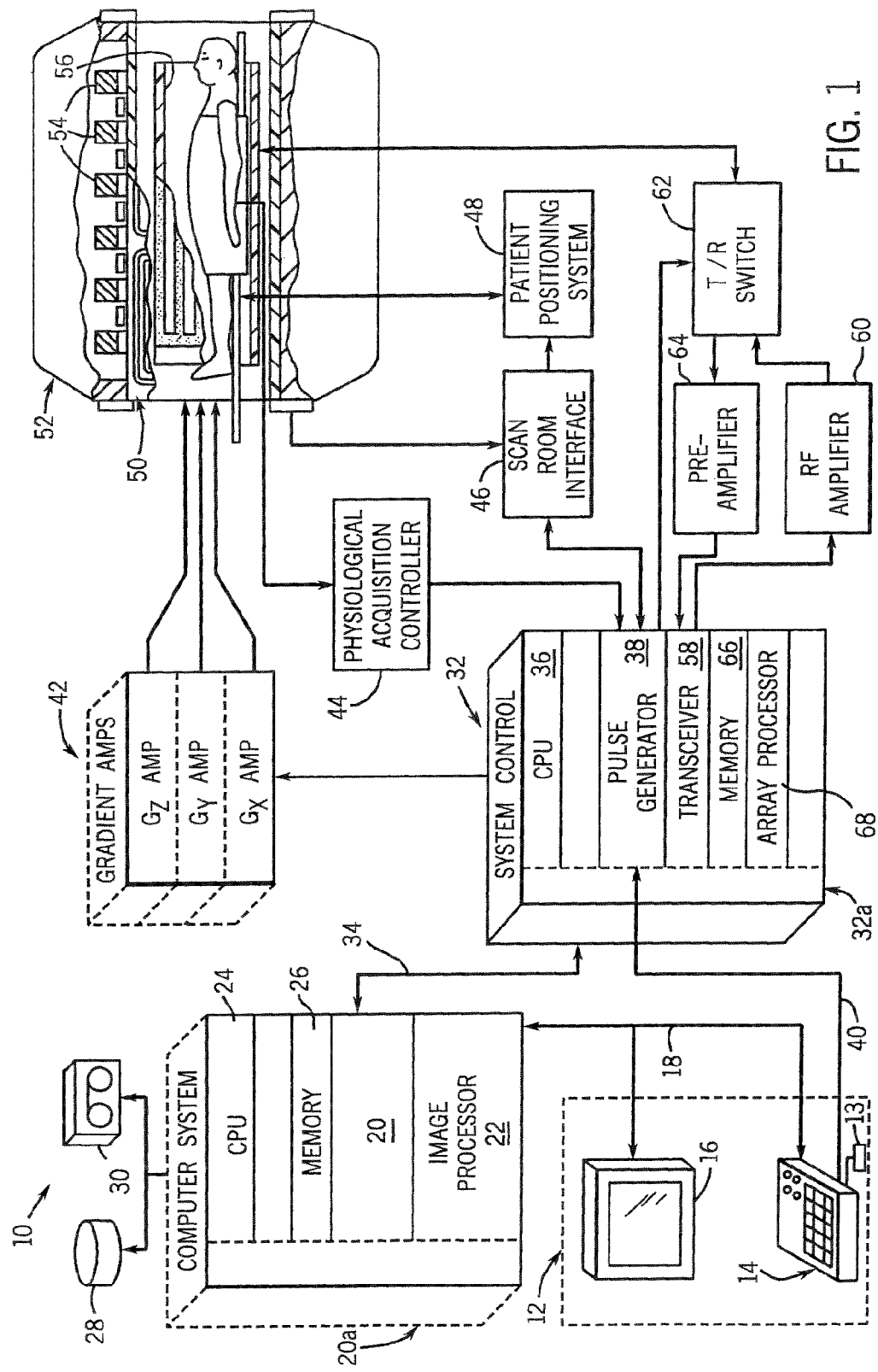
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to an imaging technique to carry out a multi-echo acquisition of MR data such that ringing artifacts associated with signal amplitude decay between echoes of the multi-echo acquisition are reduced. The present invention may be carried out with a system such as that described in FIG. 1 or equivalent thereof. The present invention is particularly applicable for acquisition of MR data at field strengths of 1.5 T and higher.

Figure 2:
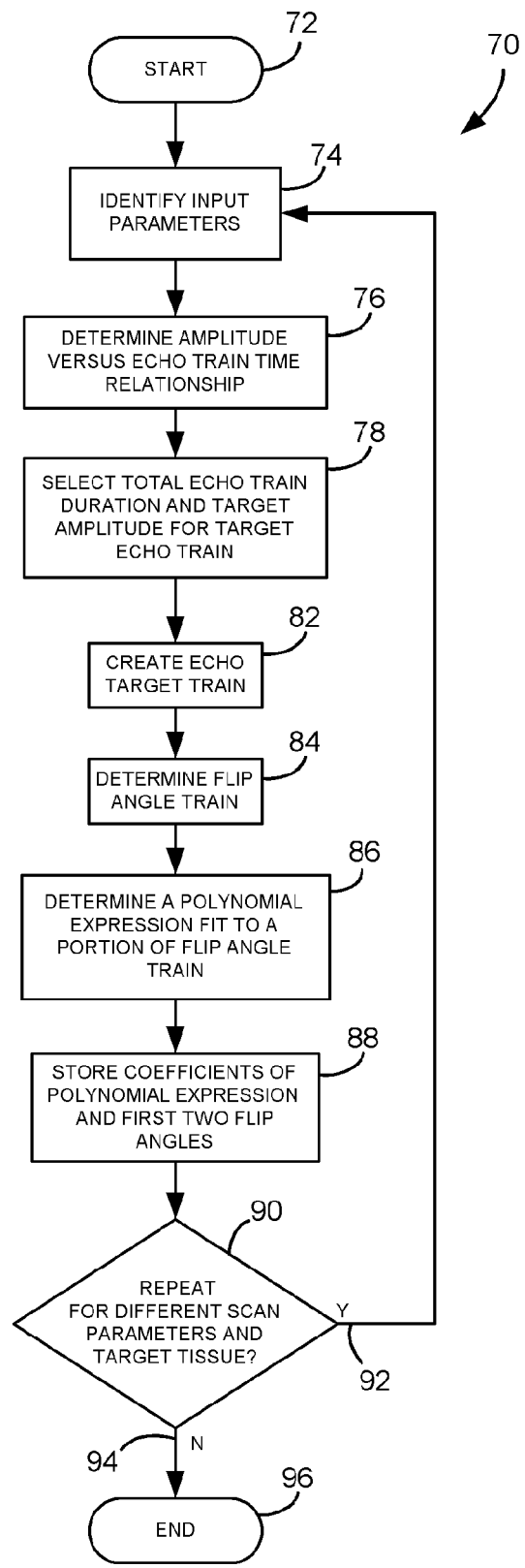
FIG. 2 is a flow chart setting forth the steps of determining and storing a flip angle train in accordance with the present invention.

Referring now to FIG. 2, a flow chart setting for the steps of a technique 70 for determining and storing a flip angle train for a multi-echo acquisition is shown. Technique 70 is preferably carried out as a set of instructions of a computer program. Further, the computer program may be bundled within a computer data signal that may be embodied in a carrier wave for uploading/downloading to an MR scanner.

Technique 70 is carried out to generate a variable flip angle train for a multi-echo acquisition. Preferably, the technique is repeatably carried out for different tissue types and scan parameters to populate a database with coefficient values of a polynomial expression of a flip angle train. As will be described, the coefficient values may be accessed to generate a flip angle train matched to a target tissue identified for inspection and the parameters of a scan to acquire data with contrast of the target tissue. Technique 70 may be used to determine and store values for coefficients for a multi-order flip angle polynomial expression for use in 2D or 3D MR data acquisition. Technique 70 preferably begins at step 72, and an identification of input parameters including tissue type, tissue T1 and T2 values, and Echo Spacing Time (EST) among others occurs at step 74. An amplitude versus total echo train time relationship is determined at 76. The amplitude versus total echo train time relationship is determined through a numerical solution of Bloch Equations such as:

$$\frac{dM_{x'}}{dt} = (\omega_0 - \omega)M_{y'} - \frac{M_{x'}}{T_2}, \quad \text{(Eqn. 1)}$$

$$\frac{dM_{y'}}{dt} = -(\omega_0 - \omega)M_{x'} + 2\pi\gamma B_1 M_z - \frac{M_{y'}}{T_2}, \text{ and} \quad \text{(Eqn. 2)}$$

$$\frac{dM_z}{dt} = -2\pi\gamma B_1 M_{y'} - \frac{(M_z - M_{z_0})}{T_1}. \quad \text{(Eqn. 3)}$$

Figure 3:
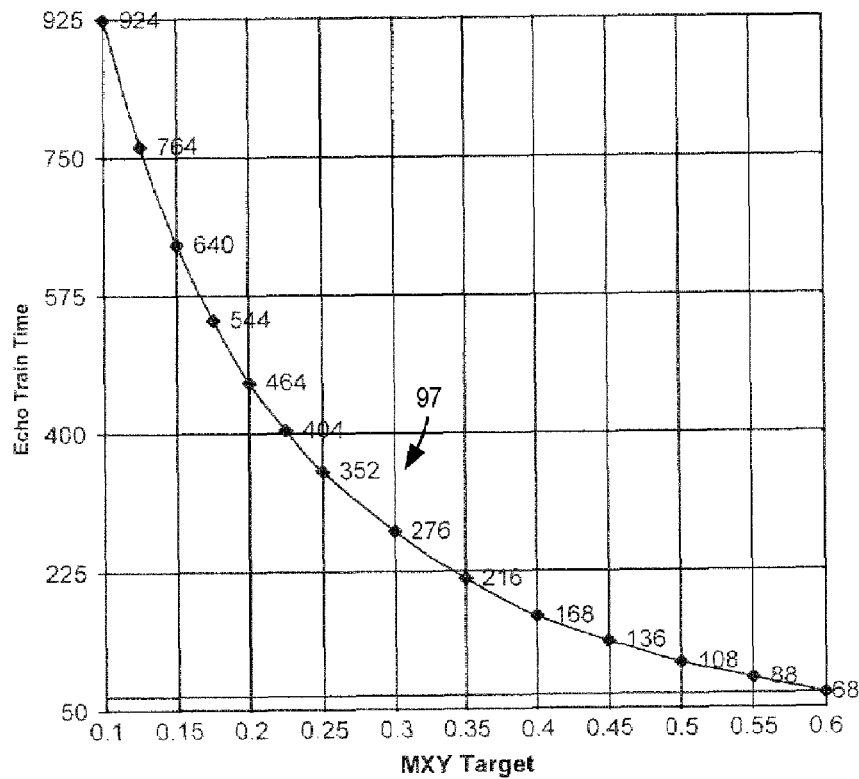
FIG. 3 is a graph illustrating target amplitudes versus total echo train times for white matter at 3T.

Referring to FIG. 3, an exemplary graph illustrating a target amplitude versus total echo train time relationship is shown. Curve 97 shows the relationship between target amplitude and total echo train time for white matter at 3 Tesla with a T1=1000 ms and a T2=100 ms and EST equal to 4 milliseconds. From this target amplitude and EST relationship, a given target amplitude and a corresponding total echo train duration time may be found, and vice-versa.

Referring back to FIG. 2, total echo train duration time for the input parameters is selected at 78 as is the target amplitude corresponding to the echo train duration from curve 97. An echo target train is created at step 82. The echo target train defines the amplitudes of the echoes to be sampled during the total echo duration time. To reduce ringing artifacts, it is preferred to acquire MR data when the maximum amplitude for the echoes is substantially uniform, i.e. equals the target amplitude.

Figure 4:
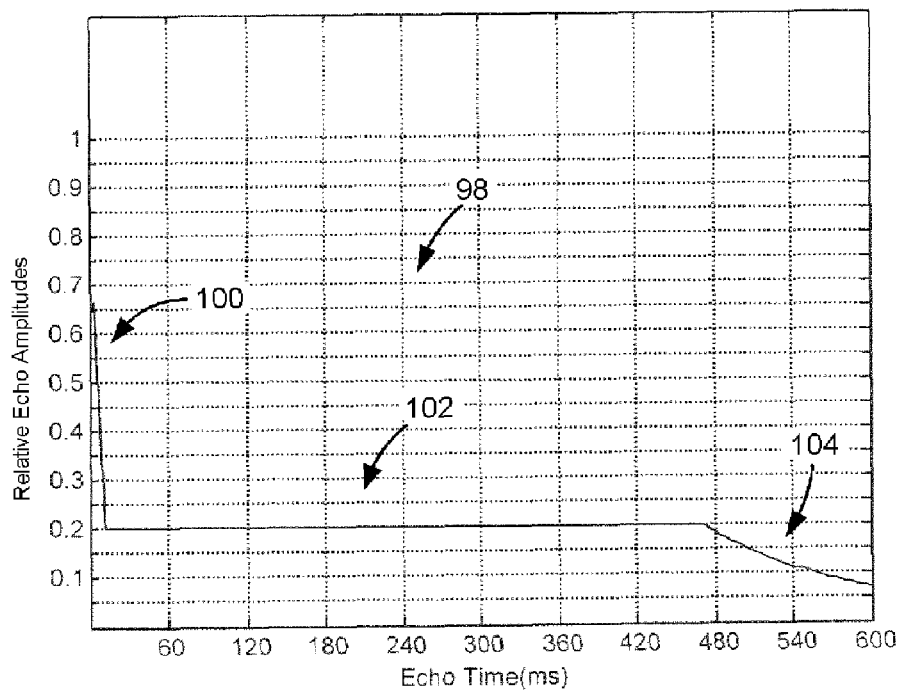
FIG. 4 is a graph illustrating a target echo amplitude train for white matter at 3T.

An exemplary echo target train is shown in FIG. 4. Echo target train 98 has a target amplitude of 0.2 for a majority of echoes of a multi-echo acquisition for white matter at 3 Tesla. Segment 100 represents target amplitudes of the first three echoes. The first echo has an amplitude set to 0.6. The second echo has an amplitude set to a value half way between 0.6 and the target echo amplitude, e.g. 0.2. In the illustrated example, the second echo has an amplitude of 0.4. The third echo has an amplitude set to the target echo amplitude of 0.2. Segment 102, which comprises a majority of the echoes, represents echoes desired to have amplitudes equal to the target echo amplitude of 0.2. The duration time of segment 102 is determined from the total echo train duration time selected at step 78. Segment 104 represents echoes having amplitudes less than the target echo amplitude.

Referring again to FIG. 2, the echo target train created at step 82 is used to determine a flip angle train at step 84. The flip angle train corresponds to the values of the flip angles of a multi-echo acquisition that yields echo amplitudes provided in the echo target train created at step 82. The flip angles determined for each echo in the echo target train may be selected to maintain cumulative RF deposition during data acquisition within a prescribed level.

Figure 5:
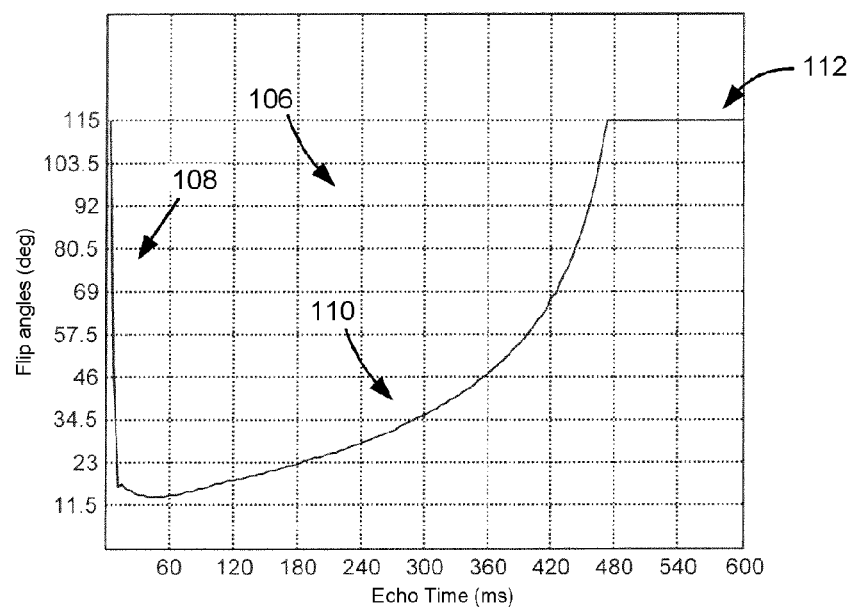
FIG. 5 is a graph illustrating a flip angle train determined from the target echo amplitude train of FIG. 4.

FIG. 5 illustrates a graph of a flip angle train determined from the echo target train 98. Flip angle train 106 is determined using a numerical solution of Bloch Equations and known gradient search algorithms. Therefrom, the flip angle for each data acquisition pulse in the echo target train that yields the target amplitude at each echo is determined. Flip angle train 106 has a linear segment 108, a non-linear segment 110, and a constant segment 112. Segments 108, 110, and 112 correspond to flip angles determined for the echoes in segments 100, 102, and 104 of echo target train 98, respectively. As described below, a polynomial fit is applied to segment 110 to determine a polynomial expression or expression that substantially describes segment 110. The polynomial expression provides values for coefficients of a known expression used to define the flip angle of each data acquisition pulse of a pulse sequence such that ringing artifacts from amplitude decay are reduced.

Referring back to FIG. 2, a polynomial expression is fit at step 86 to a portion of the flip angle train determined at step 84. The polynomial expression is fit to the portion of the flip angle train corresponding to the flip angles that are determined to yield echo amplitudes substantially equal to the target amplitude. In particular, the polynomial fit is applied to the non-linear segment 110 of flip angle train 106 to yield flip angle values set forth in curve 114 of FIG. 6.

Figure 6:
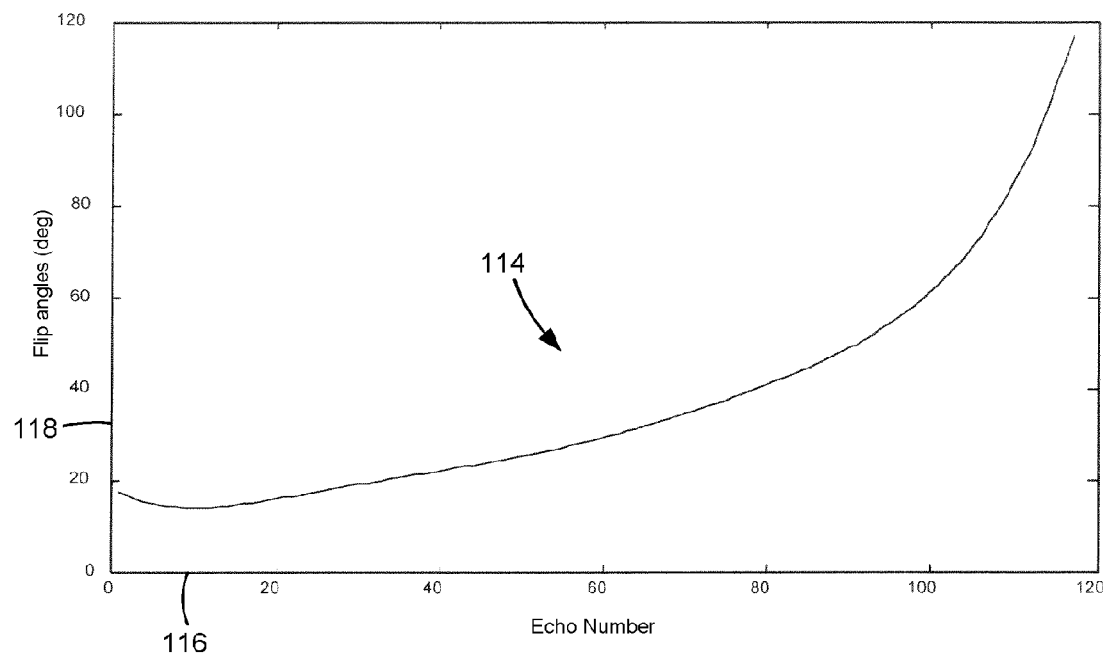
FIG. 6 is a graph illustrating a polynomial expression fit to a non-linear portion of the flip angle train of FIG. 5.

Referring now to FIG. 6, a graph is illustrated of a polynomial expression fit to segment 110 of flip angle train 106. Curve 114 graphically represents a sixth order polynomial expression fit to segment 110 of flip angle train 106. It is recognized that polynomials of less or more than sixth order are possible and contemplated. Coefficients a0, a1, a2, a3, a4, a5, and a6 for curve 114 are 18.59, −132.79, 1241.31, −4486.70, 8368.94, −7667.48, and 2775.30, respectively. Flip angles for data pulses yielding echo amplitudes substantially equal to the target amplitude may be determined from the following sixth order polynomial expression:

$$\text{flip angle}(i) = a_6 x^6 + a_5 x^5 + a_4 x^4 + a_3 x^3 + a_2 x^2 + a_1 x + a_0$$

(Eqn. 4), where $$x = \frac{(i-2) \times \text{actual echo spacing time}}{\text{default echo spacing time}}.$$

The default echo spacing time represents the echo spacing time used during the creation of echo target train at step 82 of FIG. 2. The actual echo spacing time represents the echo spacing time determined from the given parameters, i.e., TR, TE, and number of echoes of the to-be-executed MR scan. Horizontal axis 116 of the graph represents the echo number of the echoes in segment 102 of echo target train 98. The flip angle, in degrees, is represented by vertical axis 118.

Referring back to FIG. 2, the first and second discrete flip angles of segment 108 of flip angle train 106 and the coefficients of the polynomial expression fit 114 to the non-linear segment 110 of the flip angle train at step 86 are stored in a database at step 88 and may be recalled prior to an MR scan, as will be described. The database may be accessed for determination of a flip angle train matching desired parameters of a to-be-implemented scan. It is also contemplated that the flip angle expression may be determined on-the-fly. In this manner, it is not necessary to recall the flip angle polynomial expression from the database. At step 90, a decision is made to repeat steps 74–88 for a different set of scan parameters and target tissue. In this manner, coefficient values for a number of polynomial expressions may be stored and recalled for an MR scan to provide flip angles matched to a tissue type and specific prescription parameters. If the decision is made at step 92 to repeat steps 74–88, the process returns to step 74 and continues as described above for steps 74–88. Otherwise, the process ends 96.

Figure 7:
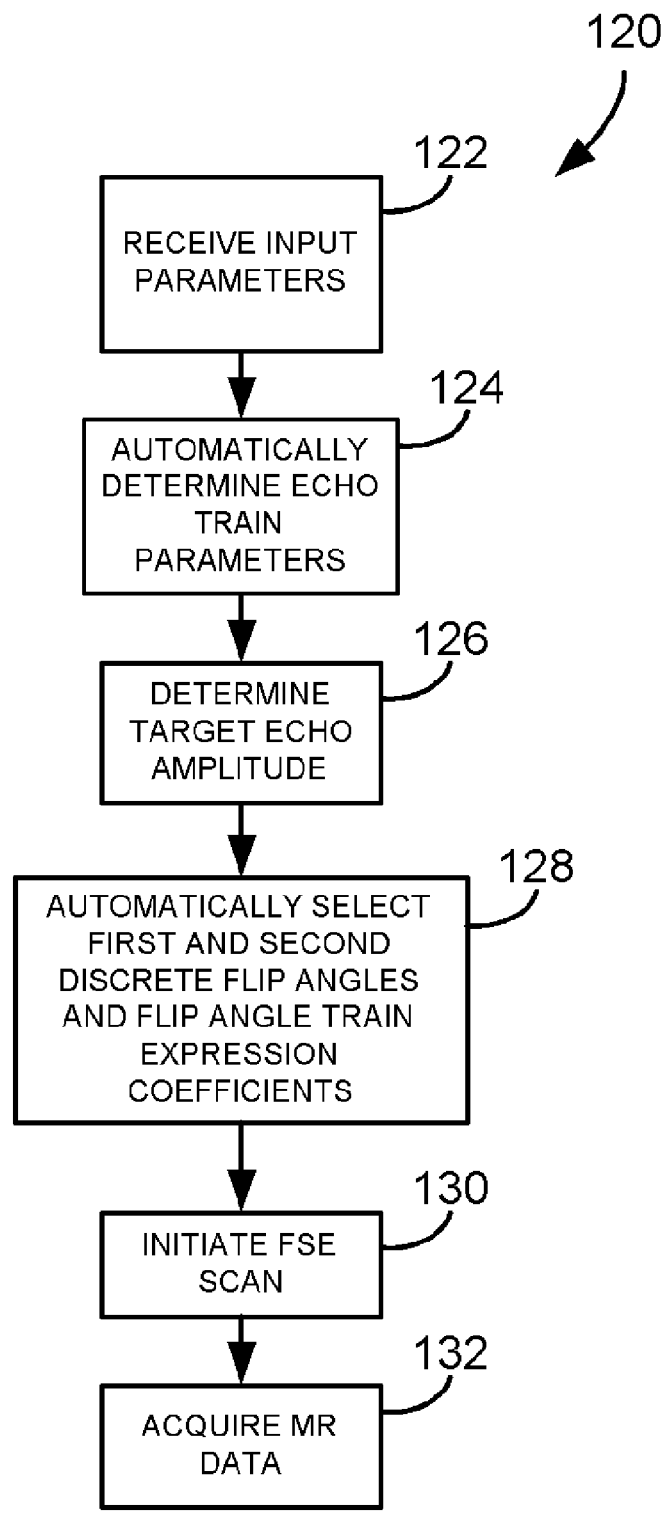
FIG. 7 is a flow chart setting forth the steps of an FSE imaging technique with a synthesis between flip angle of the data acquisition pulses, scan parameters, and tissue type in accordance with the present invention.

In FIG. 7, the steps of a method of MR imaging using stored coefficient values according to one aspect of the present invention are shown. Method 120 is preferably carried out as a set of instructions of a computer program of an MR scanner system. Method 120 preferably begins with receiving input parameters defining an MR scan at step 122. The input parameters may include tissue type, TE, TR, T1 and T2 values, EST, the number of echoes to be sampled, sequence type, field-of-view, and receiver bandwidth, among others. Total echo train time is then determined from the number of echoes to be sampled, TE, and EST at 124. From the total echo train time, a target echo amplitude is then automatically determined at step 126. A database of stored flip angles and polynomial expression coefficients is accessed and queried to determine the flip angle train corresponding to the target amplitude and total echo train time at 128. In this manner, the identified flip angle train is the most optimal of the stored flip angle trains for the given input parameters to reduce ringing artifacts and to reduce noise in the scan image.

At step 130, a flip angle train for an imaging scan, such as a FSE scan, is determined for use during the imaging scan. The imaging scan is initiated at step 132, and MR data is acquired during data acquisition at step 134 and, preferably, with the amplitude of a majority of the echoes substantially equal to the target amplitude to reduce ringing artifacts.

Therefore, in accordance with one embodiment of the present invention, an MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus also includes a computer programmed to determine, in real-time, a respective flip angle for each data acquisition pulse of a pulse sequence for multi-echo acquisition of MR data matched to a given target tissue and a given scan prescription to reduce ringing artifacts from amplitude decay of the multi-echo acquisition.

In accordance with another embodiment of the invention, a method is introduced that includes the step of receiving a user input of a given tissue targeted for MR data acquisition and at least one parameter of a scan to acquire MR data. The method also includes the step of determining an echo train duration time for a multi-echo acquisition of MR data for a scan carried out with the at least one parameter to acquire MR data with contrast of the given tissue. The method further includes the steps of determining a target amplitude for a majority of echoes of the multi-echo acquisition and determining a flip angle for each data acquisition pulse of the multi-echo acquisition to acquire MR data such that, for the majority of the echoes of the multi-echo acquisition, a maximum echo amplitude is substantially equal to the target amplitude.

In accordance with another embodiment of the invention, the invention is embodied in a computer program stored on a computer readable storage medium and having instructions which, when executed by a computer, cause the computer to determine a target amplitude versus echo train time relationship for a multi-echo acquisition of MR data from a given target tissue. The computer is further caused to determine a desired maximum amplitude for a plurality of echoes of the multi-echo acquisition for a user-prescribed MR scan from the target amplitude versus echo train time relationship. The computer is further caused to determine a flip angle for each data acquisition pulse of the prescribed MR scan such that the plurality of echoes has a maximum amplitude substantially equal to the desired maximum amplitude.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to determine, in real-time, a respective flip angle for each data acquisition pulse of a pulse sequence for multi-echo acquisition of MR data matched to a given target tissue and a given scan prescription to reduce ringing artifacts from amplitude decay of the multi-echo acquisition.

2. The MRI apparatus of claim 1 wherein the computer is further programmed to determine the respective flip angle for each data acquisition pulse to maintain cumulative RF deposition during data acquisition within a prescribed level.

3. The MRI apparatus of claim 1 wherein the computer is further programmed to determine the respective flip angle from a selection of one of a number of stored polynomial expressions of available flip angle trains, the selected polynomial expression being most optimal of the number of stored polynomial expressions for the given target tissue T1 and T2 and the given scan prescription.

4. The MRI apparatus of claim 3 wherein the computer is further programmed to determine a most optimal polynomial expression from a target amplitude desired for the majority of echoes of the multi-echo acquisition.

5. The MRI apparatus of claim 3 wherein the computer is further programmed to determine a flip angle train for the pulse sequence from the number of stored polynomial expressions that will provide a least noisy image of the target tissue relative to flip angles of non-selected polynomial expressions of stored polynomial expressions.

6. The MRI apparatus of claim 1 wherein the computer is further programmed to determine the respective flip angle for each data acquisition pulse based on data acquisition being carried out with a polarizing magnetic field of at least 1.5 Tesla.

7. The MRI apparatus of claim 1 wherein the computer is further programmed to determine the respective flip angle for each data acquisition pulse of the pulse sequence based at least on T1 and T2 characteristics of the given target tissue.

8. The MRI apparatus of claim 1 wherein the computer is further programmed to acquire 2D or 3D MR data with a fast spin echo pulse sequence.

9. An MRI apparatus comprising:
- a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
- a computer programmed to determine, in real-time, a respective flip angle for each data acquisition pulse of a pulse sequence for multi-echo acquisition of MR data matched to a given target tissue and a given scan prescription to reduce ringing artifacts from amplitude decay of the multi-echo acquisition wherein the computer is further programmed to determine the respective flip angle from a selection of one of a number of stored polynomial expressions of available flip angle trains, the selected polynomial expression being most optimal of the number of stored polynomial expressions for the given target tissue and the given scan prescription.

* * * * *

UNITED STATES PATENT AND TRADEMARK OFFICE
CERTIFICATE OF CORRECTION

| | | |
|---|---|---|
| PATENT NO. | : 7,227,356 B1 | Page 1 of 1 |
| APPLICATION NO. | : 10/711239 | |
| DATED | : June 5, 2007 | |
| INVENTOR(S) | : Hariharan et al. | |

It is certified that error appears in the above-identified patent and that said Letters Patent is hereby corrected as shown below:

Title Page; item (75)
Col. 1, Cover Sheet, line 5 (Inventors), delete "Anthony Vu" and
    substitute therefore -- Anthony T. Vu --.

Signed and Sealed this

Seventh Day of August, 2007

JON W. DUDAS
*Director of the United States Patent and Trademark Office*